(12) United States Patent
Kuo et al.

(10) Patent No.: US 11,243,353 B2
(45) Date of Patent: Feb. 8, 2022

(54) SEMICONDUCTOR DEVICE AND METHOD OF MANUFACTURING

(71) Applicant: Taiwan Semiconductor Manufacturing Company, Ltd., Hsinchu (TW)

(72) Inventors: Ying-Hao Kuo, Hsinchu (TW); Tien-Yu Huang, Shuishang Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 147 days.

(21) Appl. No.: 16/727,616

(22) Filed: Dec. 26, 2019

(65) Prior Publication Data
US 2020/0132932 A1 Apr. 30, 2020

Related U.S. Application Data

(60) Continuation of application No. 15/167,060, filed on May 27, 2016, now Pat. No. 10,527,791, which is a (Continued)

(51) Int. Cl.
| G02B 6/12 | (2006.01) |
| G02B 6/122 | (2006.01) |
| G02B 6/124 | (2006.01) |
| G02B 6/136 | (2006.01) |
| G02B 6/42 | (2006.01) |
| G02B 5/18 | (2006.01) |

(Continued)

(52) U.S. Cl.
CPC ............. *G02B 6/136* (2013.01); *G02B 6/122* (2013.01); *G02B 6/124* (2013.01); *G02B 6/12004* (2013.01); *G02B 6/12007* (2013.01); *G02B 6/4214* (2013.01); *G02B 6/4245* (2013.01); *G02B 5/1857* (2013.01); *G02B 2006/121* (2013.01); *G02B 2006/12104* (2013.01); *G02B 2006/12154* (2013.01); *G02B 2006/12164* (2013.01); *G02B 2006/12176* (2013.01); *H01L 21/31111* (2013.01); *H01L 21/31116* (2013.01); *H01L 21/76877* (2013.01)

(58) Field of Classification Search
CPC ............. G02B 5/1857; G02B 6/12004; G02B 6/12007; G02B 6/122; G02B 6/124; G02B 6/136; G02B 6/4214; G02B 6/4245; G02B 2006/121; G02B 2006/12104; G02B 2006/12154; G02B 2006/12164; G02B 2006/12176; H01L 21/31111; H01L 21/31116; H01L 21/76877
See application file for complete search history.

(56) References Cited

U.S. PATENT DOCUMENTS 5,675,675 A * 10/1997 Trouchet ............ G02B 6/12007 385/14
6,208,791 B1 3/2001 Bischel et al.
(Continued)

*Primary Examiner* — Ryan A Lepistio
(74) *Attorney, Agent, or Firm* — Slater Matsil, LLP

(57) ABSTRACT

A semiconductor device includes a substrate, a trench in the substrate, the trench having an inclined sidewall, a reflective layer over the inclined sidewall, a grating structure over the substrate, and a waveguide in the trench. The waveguide is configured to guide optical signals between the grating structure and the reflective layer.

20 Claims, 9 Drawing Sheets

Related U.S. Application Data division of application No. 14/102,605, filed on Dec. 11, 2013, now Pat. No. 9,354,390.

(51) Int. Cl.
*H01L 21/311* (2006.01)
*H01L 21/768* (2006.01)

(56) References Cited

U.S. PATENT DOCUMENTS

| | | | |
|---|---|---|---|
| 6,399,405 B1 * | 6/2002 | Chen | G01J 3/02 |
| | | | 216/2 |
| 6,800,422 B2 | 10/2004 | Thackeray et al. | |
| 8,846,129 B2 | 9/2014 | Lin et al. | |
| 2003/0197862 A1 * | 10/2003 | Cohen | G02B 6/4215 |
| | | | 356/328 |
| 2007/0086703 A1 * | 4/2007 | Kirk | G02B 6/2938 |
| | | | 385/37 |
| 2010/0099100 A1 | 4/2010 | Zaccarin et al. | |
| 2011/0150392 A1 * | 6/2011 | Qian | G02B 6/124 |
| | | | 385/37 |
| 2013/0056442 A1 | 3/2013 | Li et al. | |
| 2013/0163918 A1 * | 6/2013 | Won | G02B 6/262 |
| | | | 385/14 |
| 2015/0146268 A1 * | 5/2015 | Huang | H04N 1/02815 |
| | | | 358/475 |
| 2015/0316718 A1 | 11/2015 | Fattal et al. | |

* cited by examiner

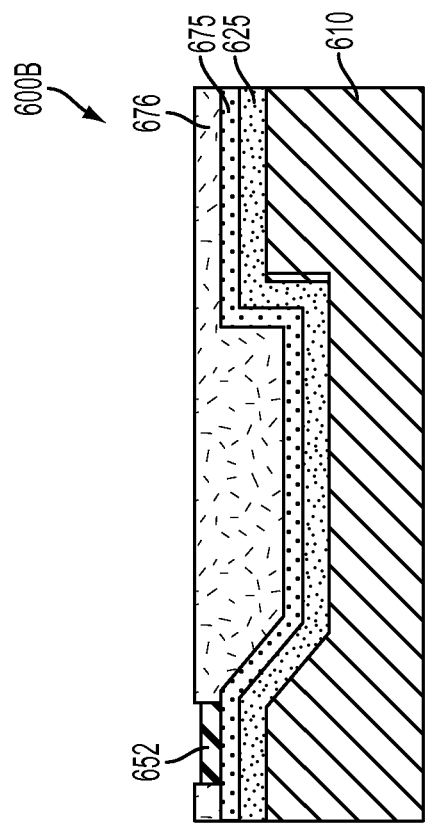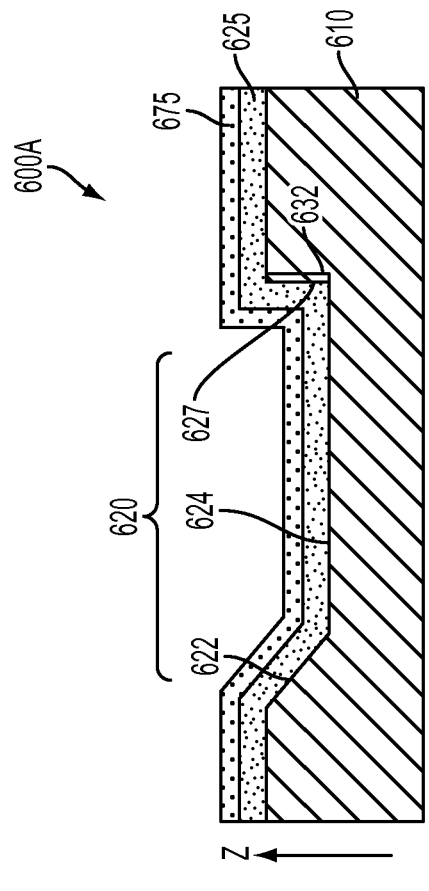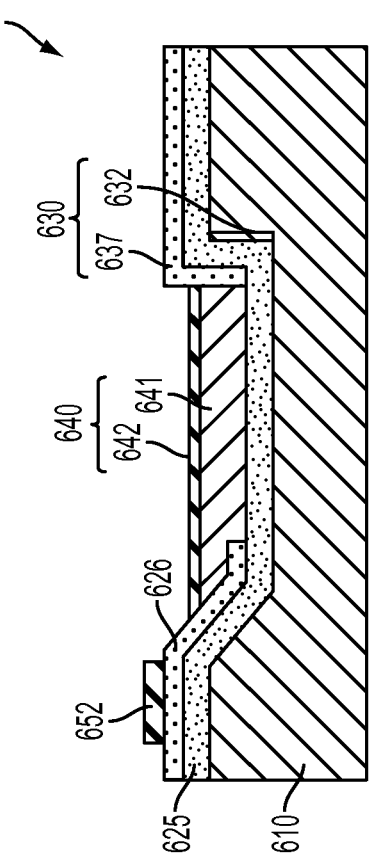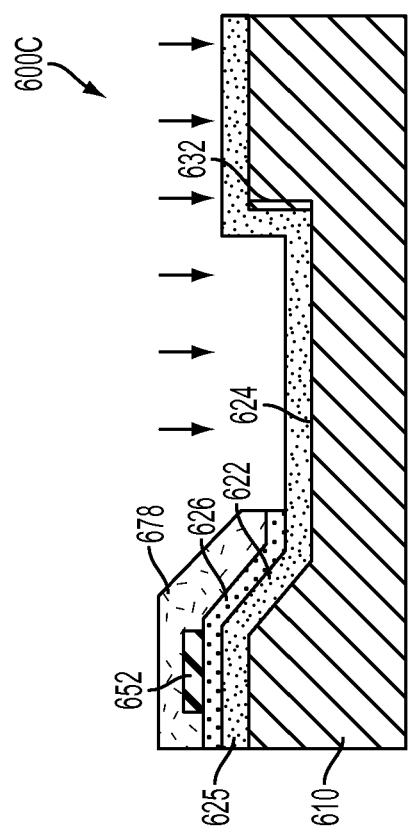

SEMICONDUCTOR DEVICE AND METHOD OF MANUFACTURING

CROSS-REFERENCE TO RELATED APPLICATIONS

This application is a continuation of U.S. application Ser. No. 15/167,060, entitled "Semiconductor Device and Method of Manufacturing," filed on May 27, 2016, which application is a division of U.S. application Ser. No. 14/102,605, entitled "Semiconductor Device and Method of Manufacturing," filed on Dec. 11, 2013, now U.S. Pat. No. 9,354,390 issued on May 31, 2016, which applications are hereby incorporated herein by reference.

BACKGROUND

As integrated circuits (ICs) become increasingly smaller and faster, electrical signals used in various types of ICs are also subject to increasing delays caused by capacitance, inductance, or resistance in the ICs. At a certain high speed and/or frequency, such delays become a design concern. To avoid potential signal delay issues, optical signals are used instead of electrical signals for data transmission in some situations.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 6A-6F are schematic cross-sectional views of a semiconductor device at various stages during manufacture in accordance with some embodiments.

DETAILED DESCRIPTION OF ILLUSTRATIVE EMBODIMENTS

Figure 1:
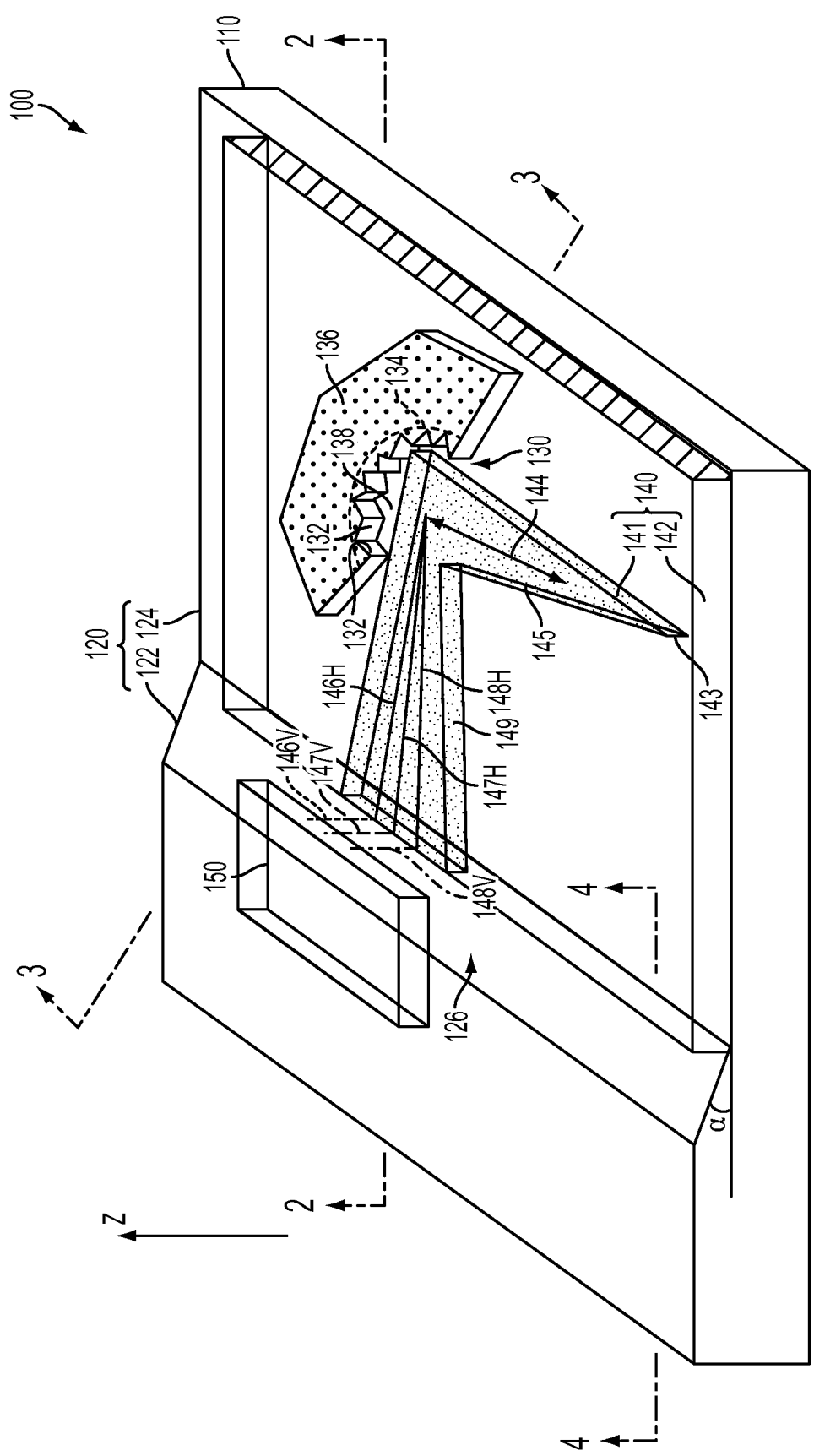
FIG. 1 is a schematic, perspective view of a semiconductor device in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

In some embodiments, a semiconductor device comprises a substrate and a grating structure over the substrate. The substrate further has a trench with an inclined sidewall. A reflective layer is over the inclined sidewall. A waveguide is in the trench between the reflective layer and the grating structure. In at least one embodiment, the grating structure is configured to multiplex (also referred to as "mux") and/or demultiplex (also referred to as "demux") optical signals. The waveguide is configured to guide optical signals between the grating structure and the reflective layer. The reflective layer is configured to direct optical signals demuxed, or to be muxed, by the grating structure between the waveguide and external optical circuitry located out of a plane of the waveguide. As a result, one or more embodiments optical routing and wavelength multiplexing/demultiplexing are integrated in a single substrate. In at least one embodiment, the resulting semiconductor device includes a wavelength-division multiplexing (WDM) demultiplexer and/or multiplexer which has a low profile and/or configuration flexibility for operation over a wide range of wavelengths, without being limited to a specific range of wavelengths and/or a specific substrate structure as in other approaches.

FIG. 1 is a schematic, perspective view of a semiconductor device 100 in accordance with some embodiments. The semiconductor device 100 comprises a substrate 110, a trench 120 in the substrate 110, a grating structure 130 over the substrate 110, a waveguide 140 in the trench 120, and an optical component 150 mounted over the substrate 110.

In some embodiments, the substrate 110 includes a silicon carbide (SiC) substrate, sapphire substrate, a silicon (Si) substrate or a glass substrate. In at least one embodiment, the substrate 110 includes one or more electrical components. Examples of electrical components include, but are not limited to, resistors, capacitors, inductors, diodes, field effect transistors (FETs), metal-oxide-semiconductor FETs (MOSFETs), complementary metal-oxide-semiconductor (CMOS) transistors, and bipolar transistors.

The trench 120 includes an inclined sidewall 122 and a bottom 124. In some embodiments, an angle α between the inclined sidewall 122 and a plane of the substrate 110 is in the range from 40 degrees to 50 degrees. In at least one embodiment, the angle α is 45 degrees. The inclined sidewall 122 is formed in one or more embodiments by a wet etch as described herein. A reflective layer 126 is over the inclined sidewall 122. Example reflective materials of the reflective layer 126 include, but are not limited to, Cu, Au, Ag, Al, and Ti. In at least one embodiment, the reflective layer 126 includes a multi-layered structure in which dielectrics of high and low refractive indices are arranged alternatingly. In at least one embodiment, the reflective layer 126 has a thickness of at least 500 nm and/or at least 90% reflectivity at selected wavelengths.

The grating structure 130 in one or more embodiments includes a plurality of facets 132 arranged successively along a line 134 concaved inward of a block 136. The adjacent facets 132 are angled relative to each other to form a plurality of "teeth" of the grating structure 130. The facets 132 are oriented in a direction closer to a normal direction Z of the substrate 110 than the inclined sidewall 122. In at least one embodiment, an angle between the facets 132 and the plane of the substrate 110 is in the range from 85 degrees to 95 degrees. In at least one embodiment, the angle is 90 degrees for one or more facets 132 which extend vertically or normally to the plane of the substrate 110. In some embodiments, the facets 132 of the grating structure 130 are formed in the block 136 by a dry etch as described herein. In at least one embodiment, the block 136 includes an integral part of the substrate 110. For example, the facets 132 of the grating structure 130 are formed in a sidewall other than the inclined sidewall 122 of the trench 120. In at least one embodiment, the block 136 includes a dielectric material deposited over the substrate 110, and the facets 132 of the grating structure 130 are formed in a sidewall of the dielectric material block 136. In some embodiments, a reflective layer (not shown in FIG. 1) is over the facets 132 of the grating structure 130. Example reflective materials of the reflective layer over the facets 132 include, but are not limited to, Cu, Au, Ag, Al, and Ti. The facets 132 of the grating structure 130 are configured to reflect and/or diffract optical signals depending on the wavelengths of the optical signals. As a result, optical signals having different wavelengths are reflected and/or diffracted by the grating structure 130 differently to mux and/or demux the optical signals as described herein. An example of the grating structure 130 includes, but is not limited to, an echelle grating. Other grating structures are within the scope of various embodiments.

The waveguide 140 includes a core layer 141 over the bottom 124 of the trench 120, and a cladding layer 142 (also referred to as "top cladding layer") over the core layer 141. In at least one embodiment, the substrate 110 at the bottom 124 of the trench 120 defines a bottom cladding layer for the waveguide 140. In at least one embodiment, a dielectric layer (not shown in FIG. 1) is over the bottom 124 of the trench 120 and under the core layer 141, and defines a bottom cladding layer for the waveguide 140. The refractive index of the core layer 141 is higher than that of the bottom and top cladding layers, and the refractive index difference in at least one embodiment is in the range from 0.05 to 1. Example materials for the core layer 141 and the cladding layer 142 include, but are not limited to, polymer, spin-on-dielectric, high-k material, $SiO_2$, $SiN_x$, and low-k material. In at least one embodiment, at least the core layer 141 includes a material transparent to visible light and/or infrared (IR) optical signals. The shape and/or size of the waveguide 140, and/or the spatial relationship between the waveguide 140 and the grating structure 130, as illustrated in FIG. 1, are examples. In some embodiments, the core layer 141 and the cladding layer 142 fills the concave region 138 defined by the grating structure 130, and comes into contact with the facets 132. Other arrangements are within the scope of various embodiments.

The optical component 150 is configured to process, receive and/or transmit optical signals. Examples of the optical component 150 include, but are not limited to, light emitting devices such as lasers and light emitting diodes, light detecting devices such as photo-sensors, optical modulators, and optical couplers. In at least one embodiment, the optical component 150 includes at least one light source, such as an array of vertical cavity surface emitting laser (VCSEL). In at least one embodiment, the optical component 150 includes at least one optical sensor, such as an array of photo diodes.

In at least one embodiment, the semiconductor device 100 includes an optical port 143 for input and/or output of optical signals to and/or from the waveguide 140. For example, the optical port 143 includes an exposed end of the waveguide 140 on an edge of the substrate 110. An end of an external optical fiber is attachable to the optical port 143. A multi-wavelength optical signal (also referred to herein as "multiplexed optical signal") 144 is inputted into and/or outputted from the waveguide 140 via the optical port 143. In at least one embodiment, a lens (not shown in FIG. 1) is arranged at the optical port 143 to focus the multiplexed optical signal 144 into the waveguide 140 and/or the external optical fiber.

In one or more embodiments, the semiconductor device 100 includes a WDM demultiplexer. A multiplexed optical signal 144 is inputted into the waveguide 140 via the optical port 143. The multiplexed optical signal 144 is guided along a first portion 145 of the waveguide 140 toward the grating structure 130. The grating structure 130 demuxes the multiplexed optical signal 144 into a plurality of optical signals 146H, 147H, 148H having corresponding different wavelengths, and sends the optical signals 146H, 147H, 148H in corresponding different directions along a second portion 149 of the waveguide 140 toward the reflective layer 126 on the inclined sidewall 122. The optical signals 146H, 147H, 148H are reflected by the reflective layer 126, out of a plane of the waveguide 140, as optical signals 146V, 147V, 148V directed at the optical component 150. The optical component 150 includes at least one optical sensor configured to convert the received optical signals 146V, 147V, 148V into electrical signals to be processed by other circuitry of the optical component 150, or to be communicated out of the optical component 150.

In one or more embodiments, the semiconductor device 100 includes a WDM demultiplexer. A multiplexed optical signal 144 is inputted into the waveguide 140 via the optical port 143. The multiplexed optical signal 144 is guided along a first portion 145 of the waveguide 140 toward the grating structure 130. The grating structure 130 demuxes the multiplexed optical signal 144 into a plurality of optical signals 146H, 147H, 148H having corresponding different wavelengths, and sends the optical signals 146H, 147H, 148H in corresponding different directions along a second portion 149 of the waveguide 140 toward the reflective layer 126 on the inclined sidewall 122. The optical signals 146H, 147H, 148H are reflected by the reflective layer 126, out of a plane of the waveguide 140, as optical signals 146V, 147V, 148V directed at the optical component 150. The optical component 150 includes at least one optical sensor configured to convert the received optical signals 146V, 147V, 148V into electrical signals to be processed by other circuitry of the optical component 150, or to be communicated out of the optical component 150. The optical component 150, the reflective layer 126, the grating structure 130 and the waveguide 140 are arranged along an optical path of the semiconductor device 100 as described.

In one or more embodiments, the semiconductor device 100 includes a WDM multiplexer. The optical component 150 includes at least one light source configured to emit optical signals 146V, 147V, 148V toward the reflective layer 126 on the inclined sidewall 122. The optical signals 146V, 147V, 148V are reflected by the reflective layer 126 as optical signals 146H, 147H, 148H which are guided along the second portion 149 of the waveguide 140 to the grating structure 130. The grating structure 130 muxes the optical signals 146H, 147H, 148H into the multiplexed optical signal 144 and sends the multiplexed optical signal 144 along the first portion 145 of the waveguide 140 toward the optical port 143 to be communicated to external optical circuitry.

In some embodiments, optical routing and wavelength multiplexing/demultiplexing are integrated in a single substrate of a semiconductor device as described herein. As a result, the semiconductor device, which is one or more embodiments includes a WDM demultiplexer and/or WDM multiplexer, has a low profile. Additionally or alternatively, in one or more embodiments appropriate materials for the waveguide are selected depending on the wavelengths of the optical signals to be transmitted, received and/or processed by the semiconductor device. For example, when the optical signals are in the visible light wavelength range, materials transparent to the visible light are selected for at least the core layer of the waveguide. In another example, when the optical signals are in the IR wavelength range, materials transparent to the IR light are selected for at least the core layer of the waveguide. Such flexibility permits the semiconductor device in accordance with some embodiments to be configured for operation in a wide range of wavelengths. In contrast, other approaches exhibit potential limitations in the operational range of wavelengths. For example, some other approaches include a waveguide in a Si substrate of a Silicon-On-Insulator (SOI) structure. Because Si has a low transparency to visible and/or IR light, devices based on the other approaches are not operable in the visible and/or IR light wavelength range. Compared to the other approaches, some embodiments provide greater flexibility in configuration and/or operational wavelength range of the semiconductor device. Although at least one embodiment includes an SOI structure as the substrate, other embodiments are not limited to substrates based on SOI structures.

Figure 2:
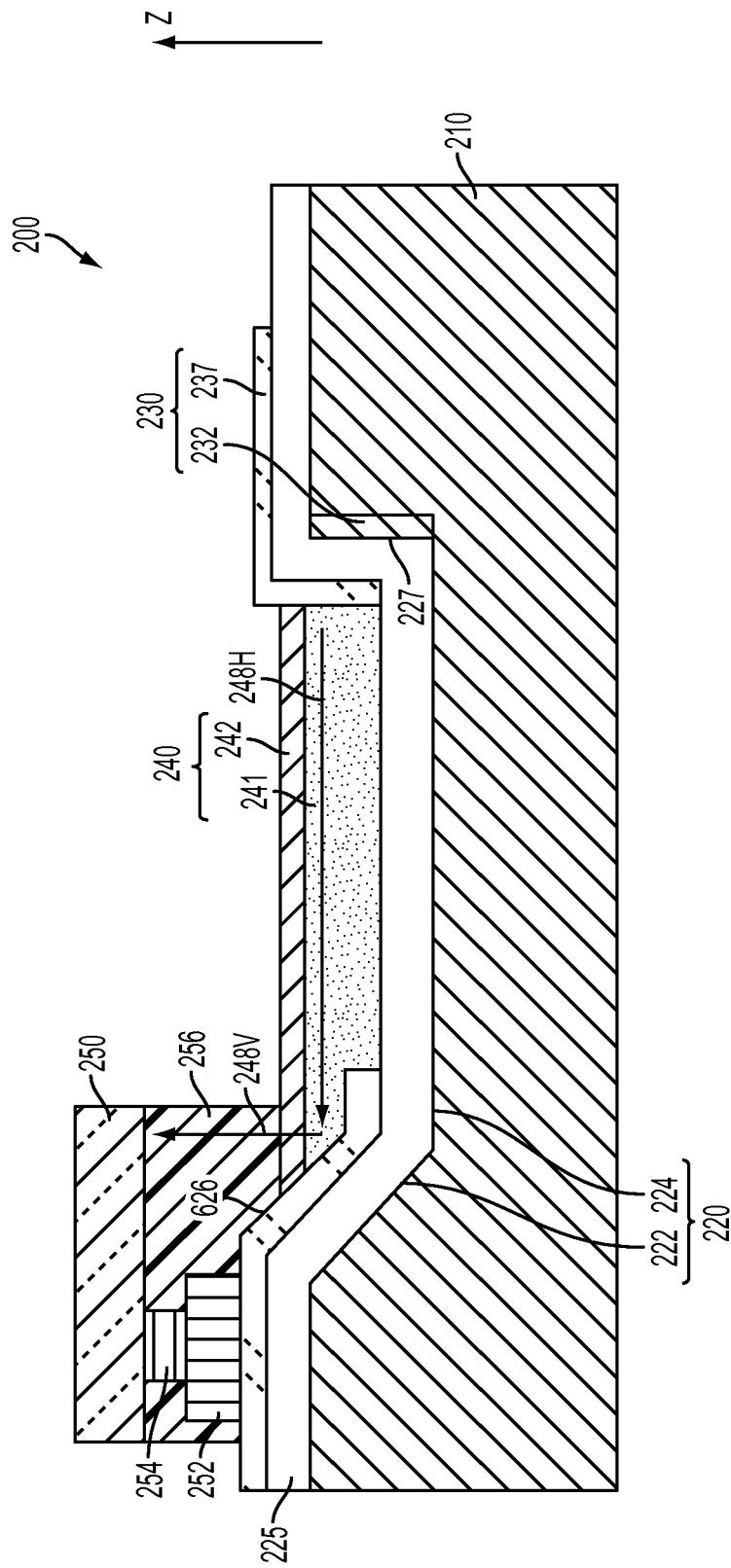
FIG. 2 is a schematic, cross-sectional view of a semiconductor device in accordance with some embodiments.

FIG. 2 is a schematic, cross-sectional view of a semiconductor device 200 in accordance with some embodiments. Elements in FIG. 2 having corresponding elements in FIG. 1 are designated by the reference numerals of FIG. 1 increased by one hundred. In some embodiments, FIG. 2 corresponds to a cross-sectional view taken along line 11-11 in FIG. 1.

The semiconductor device 200 comprises a substrate 210 having a trench 220, a grating structure 230, a waveguide 240 and an optical component 250. The trench 220 has an inclined sidewall 222 and a bottom 224. A dielectric layer 225 is over the inclined sidewall 222, the bottom 224 and the grating structure 230. A reflective layer 226 is over the dielectric layer 225 overlying the inclined sidewall 222. The grating structure 230 is in another sidewall 227 of the trench 220. The grating structure 230 includes a plurality of facets 232 (one of which is schematically illustrate in FIG. 2) and a reflective layer 237 over the facets 232. The waveguide 240 includes a core layer 241 over the dielectric layer 225 on the bottom 224, and a top cladding layer 242 over the core layer 241. The dielectric layer 225 defines a bottom cladding layer for the core layer 241. A re-distribution layer (RDL) 252 is over the reflective layer 226. At least one solder bump 254 is over the RDL 252. The optical component 250 is bonded to the at least one solder bump 254. An underfill material 256 is filled in the space between the optical component 250 and the reflective layer 226 and surrounds the RDL 252 and solder bump 254.

In at least one embodiment, the substrate 210 includes a Si substrate. The trench 220 has a depth of more than 30 µm in some embodiments.

The dielectric layer 225 defining the bottom cladding layer comprises at least one of SiO$_2$ or SiON formed by plasma-enhanced chemical vapor deposition (PECVD) in some embodiments. In one or more embodiments, spin-on dielectrics or polymers are used to form the bottom cladding layer. The thickness of the bottom cladding layer is at least 500 nm in some embodiments to prevent optical leak. The core layer 241 comprises at least one of SiON or SiN formed by PECVD in some embodiments. In one or more embodiments, spin-on dielectrics or polymers are used to form the core layer 241. The thickness of the core layer 241 is at least 15 µm in some embodiments. The top cladding layer 242 comprises at least one of SiO$_2$ or SiON formed by PECVD in some embodiments. In one or more embodiments, spin-on dielectrics or polymers are used to form the top cladding layer 242. The thickness of the top cladding layer 242 is at least 500 nm in some embodiments to prevent optical leak. In some embodiment, an optical fiber is placed in the trench 220 as the waveguide 240.

In at least one embodiment, at least one of the reflective layer 226 or the reflective layer 237 includes at least one selected from the group consisting of Cu, Au, Ag, Al, and Ti, and/or has a thickness of at least 500 nm. In at least one embodiment, the reflective layer 226 and the reflective layer 237 include the same reflective material.

The RDL 252 is electrically connected to one or more electrical components included in the semiconductor device 100. For example, the electrical components are formed in the substrate In some embodiments, the RDL 252 comprises Al, Cu, or another electrically conductive material, and/or has a thickness of at least 1 µm.

In at least one embodiment, a passivation layer (not shown in FIG. 2) partially covers the RDL 252. The passivation layer comprises at least one selected from the group consisting of SiO$_2$, SiON, SiN, or other suitable materials. The thickness of the passivation layer is in the range from 200 nm to 800 nm in some embodiments.

In at least one embodiment, an under bump metallization (UBM) layer (not shown in FIG. 2) is over the portions of the RDL 252 exposed by the passivation layer. The UBM layer comprises a suitable under-bump metallurgy, e.g., Cu/Ni.

The solder bump 254 is formed over the UBM layer and comprises lead-free solder or gold bumps in some embodiments. In at least one embodiment, the solder bump 254 comprises micro bumps for flip-chip bonding with the optical component 250. The overall thickness for the UBM layer and the solder bump 254 is in the range from 1 µm to 15 µm in some embodiments.

In some embodiments, one or more through substrate vias (TSVs) (not shown in FIG. 2) are formed through the substrate 210 to provide backside electrical connections. In at least one embodiment, one or more of the TSVs comprise Cu or another suitable electrically conductive material.

In at least one embodiment, the semiconductor device 200 operates in a manner similar to that described with respect to the semiconductor device 100. For example, a multiplexed optical signal is input via the waveguide 240 to the grating structure 230, which demuxes the multiplexed optical signal into a plurality of demuxed optical signals having different wavelengths. One of the demuxed optical signals is denoted as 248H in FIG. 2. The demuxed optical signals are guided inside the core layer 241 of the waveguide 240 to the reflective layer 226 on the inclined sidewall 222 at which the demuxed optical signals reflected out of a plane of the waveguide 240, e.g., in the normal direction Z of the substrate 210 toward the optical component 250. One of the reflected optical signals is denoted as 248V in FIG. 2. One or more effects described with respect to the semiconductor device 100 are applicable to the semiconductor device 200.

FIGS. 3A-3D are schematic cross-sectional views of a substrate 310 at various stages during an etching operation for forming a grating structure 330 in accordance with some embodiments. Elements in FIGS. 3A-3D having corresponding elements in FIG. 1 are designated by the reference numerals of FIG. 1 increased by two hundreds. In some embodiments, FIGS. 3A-3D correspond to a cross-sectional view taken along line III-III in FIG. 1.

Figure 3A:
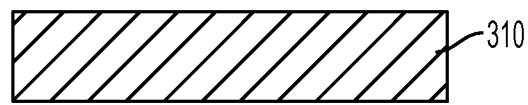
FIGS. 3A-3D are schematic cross-sectional views of a substrate at various stages during an etching operation for forming a grating structure in accordance with some embodiments.

As shown in FIG. 3A, the process starts at a substrate 310. In at least one embodiment, the substrate 310 includes a Si substrate.

Figure 3B:
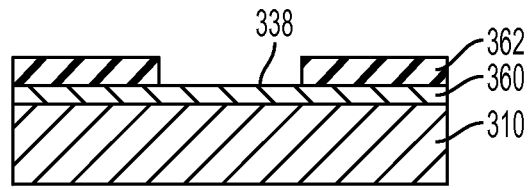

As shown in FIG. 3B, a hard mask layer 360 is deposited over the substrate 310 and, then, a photoresist layer 362 is deposited over the hard mask layer 360 while exposing a region 338 of the hard mask layer 360. In at least one embodiment, the region 338 corresponds to the region 138 and has a shape of the grating structure 130 of the semiconductor device 100 as seen in plan view. In some embodiments, the hard mask layer 360 includes at least one of SiN or $SiO_2$. In at least one embodiment, the hard mask layer 360 includes a layer of SiN of at least 300 nm in thickness. In at least one embodiment, the hard mask layer 360 includes $SiO_2$ of at least 100 nm in thickness.

Figure 3C:
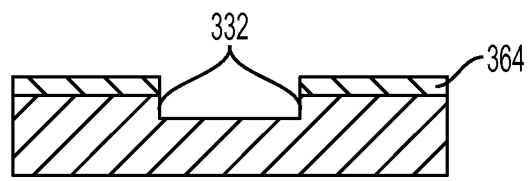

As shown in FIG. 3C, the exposed region 338 of the hard mask layer 360 is removed to form an etching mask 364. The photoresist layer 362 is then removed. An etching process is performed using the etching mask 364 to etch away the exposed portion of the substrate 310. As a result, facets 332 of the grating structure 330 are formed. In at least one embodiment, the etching process is a dry etch. For example, the etching process is a plasma etch. The facets 332 formed by the etching process are generally vertical, i.e., oriented generally in the normal direction Z of the substrate 310. In at least one embodiment, the facets 332 are etched to a depth of at least 30 µm in the substrate 310.

Figure 3D:
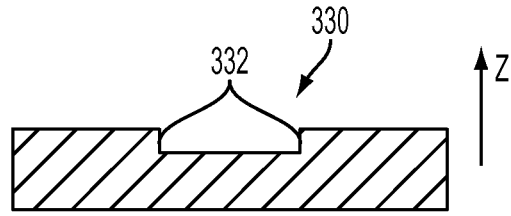

As shown in FIG. 3D, the etching mask 364 is removed, leaving the grating structure 330 on the substrate 310.

FIGS. 4A-4D are schematic cross-sectional views of a substrate 410 at various stages during an etching operation for forming a trench 420 with an inclined sidewall 422 in accordance with some embodiments. Elements in FIGS. 4A-4D having corresponding elements in FIGS. 3A-3D are designated by the reference numerals of FIGS. 3A-3D increased by one hundred. Elements in FIGS. 4A-4D having corresponding elements in FIG. 1 are designated by the reference numerals of FIG. 1 increased by three hundreds. In some embodiments, FIGS. 4A-4D correspond to a cross-sectional view taken along line IV-IV in FIG. 1.

Figure 4A:
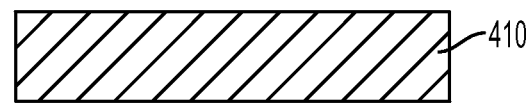
FIGS. 4A-4D are schematic cross-sectional views of a substrate at various stages during an etching operation for forming a trench with an inclined sidewall in accordance with some embodiments.

As shown in FIG. 4A, the process starts at a substrate 410. In at least one embodiment, the substrate 410 corresponds to the substrate 310.

Figure 4B:
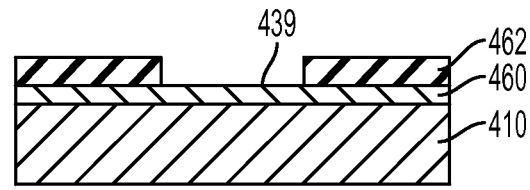

As shown in FIG. 4B, a hard mask layer 460 is deposited over the substrate 410 and, then, a photoresist layer 462 is deposited over the hard mask layer 460 while exposing a region 439 of the hard mask layer 460. In at least one embodiment, the hard mask layer 460 and the hard mask layer 360 belong to the same hard mask layer formed over the same substrate 310 (or 410). The photoresist layer 462 and the photoresist layer 362 belong to the same photoresist layer formed over the hard mask layer while exposing the corresponding regions 439, 338. In some embodiments, the hard mask layer 460 includes at least one of SiN or $SiO_2$. In at least one embodiment, the hard mask layer 460 includes a layer of SiN of at least 40 nm in thickness. In at least one embodiment, the hard mask layer 460 includes $SiO_2$ of at least 100 nm in thickness.

Figure 4C:
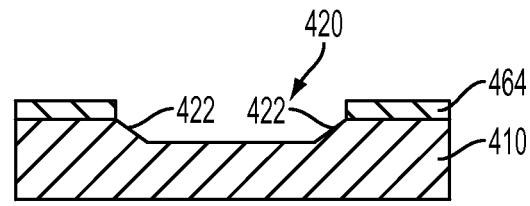

As shown in FIG. 4C, the exposed region 439 of the hard mask layer 460 is removed to form an etching mask 464. The photoresist layer 462 is then removed. An etching process is performed using the etching mask 464 to etch away the exposed portion of the substrate 410. As a result, a trench 420 with an inclined sidewall 422 is formed. In at least one embodiment, the etching process is a wet etch. For example, the etching process is an anisotropic wet etch using a KOH(aq)/IPA or TMAH solution. In at least one embodiment, a method to control the anisotropic wet etch is achieved by using KOH (25 wt %-35 wt %) with no less than 5 wt % IPA quantity. In at least one embodiment, the temperature of the etch solution is kept in the range from 60° C. to 70° C. during the wet etching to achieve an etch rate in the range from 0.2 to 0.6 micron per minute during the wet etching and to prevent excessive hillock formation. Other etching processes for forming trenches with inclined sidewalls are within the scope of various embodiments, for example, as described in one or more of U.S. application Ser. No. 13/403,566, filed on Feb. 23, 2012, U.S. application Ser. No. 13/749,388, filed on Jan. 24, 2013, and U.S. application Ser. No. 13/905,404, filed on May 30, 2013. The above-listed US applications are incorporated by reference herein in their entirety.

During the wet etching, in some embodiments, the etching mask 464 is partially etched, widening the exposed portion of the substrate 410 and resulting in a larger trench 420 than the original exposed region 439. In some embodiments, the wet etching process of FIG. 4C and dry etching process of FIG. 3C are performed separately over different regions 338, 439 of the same substrate 310 (410). The facets 332 are at least partially co-elevational with the inclined sidewall 422 as a result of the etching processes.

Figure 4D:
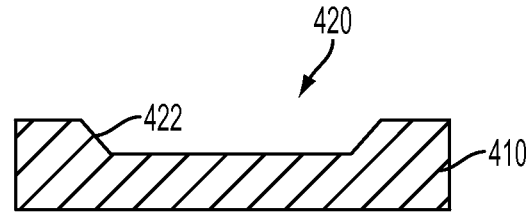

As shown in FIG. 4D, the etching mask 464 is removed, leaving the trench 420 with the inclined sidewall 422 in the substrate 410.

Figure 5:
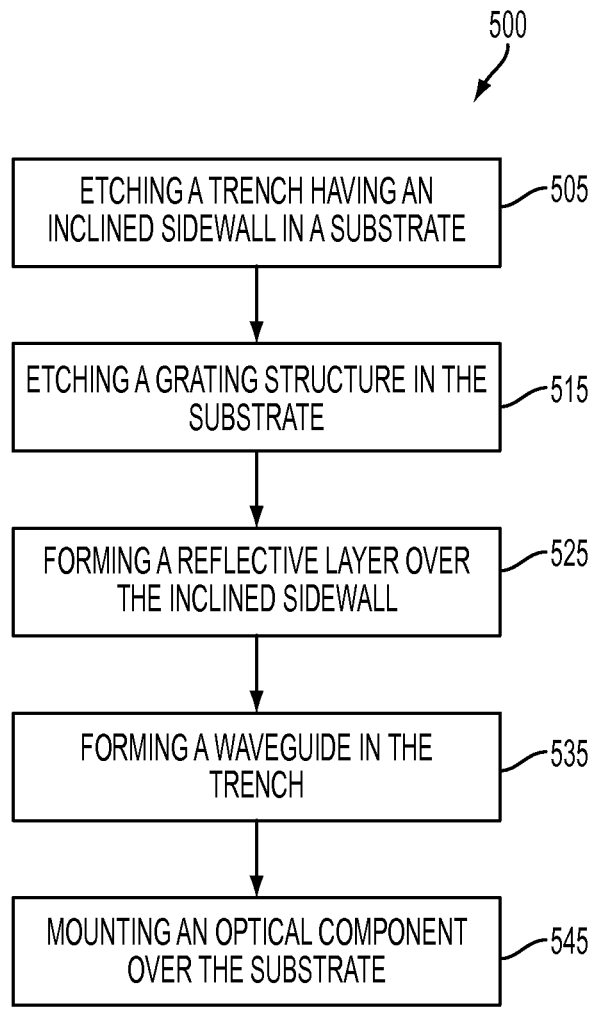
FIG. 5 is a flow chart of a method of manufacturing a semiconductor device in accordance with some embodiments.

FIG. 5 is a flow chart of a method 500 of manufacturing a semiconductor device in accordance with some embodiments, and FIGS. 6A-6F are schematic cross-sectional views of the semiconductor device at various stages during manufacture in accordance with some embodiments. In some embodiments, the method 500 is performed to manufacture the semiconductor device 200 described with respect to FIG. 2. Elements in FIGS. 6A-6F having corresponding elements in FIG. 2 are designated by the reference numerals of FIG. 2 increased by four hundreds.

At operation 505, a trench having an inclined sidewall is etched in a substrate. For example, as shown in FIG. 6A, a trench 620 having an inclined sidewall 622 is etched in a substrate 610, in the manner described with respect to FIGS. 4A-4D.

At operation 515, a grating structure is etched in the substrate. For example, as shown in FIG. 6A, facets 632 of a grating structure are etched in another sidewall 627 of the trench 620, in the manner described with respect to FIGS. 3A-3D. The sidewall 627 is oriented in a direction closer to the normal direction Z of the substrate 610 than the inclined sidewall 622.

At operation 525, a reflective layer is formed over the inclined sidewall of the trench. For example, as shown in FIG. 6A, a dielectric layer 625 is formed to extend continuously over the inclined sidewall 622 and the bottom 624 of the trench 620, and over the facets 632 of the grating structure. In at least one embodiment, the dielectric layer 625 includes at least one of $SiO_2$ or SiON and is formed by PECVD. A reflective material 675 is formed over the dielectric layer 625 to continuously extending over the inclined sidewall 622, the bottom 624 of the trench 620, and the facets 632 of the grating structure. In some embodiments, the reflective material 675 is formed by depositing a seed layer, then a barrier/adhesion metal layer, such as Ti or Cr, and finally a highly reflective metal such as Al, Cu, Ag, or Au. Examples of the deposition process include, but are not limited to, physical vapor deposition (PVD) and electroplating. A resulting structure 600A is obtained as shown in FIG. 6A.

As shown in FIG. 6B, a photoresist layer 676 is formed over the reflective material 675 of the structure 600A. The photoresist layer 676 is developed and patterned to form at least one opening therein, and an RDL 652 is formed in the at least one opening of the photoresist layer 676. In at least one embodiment, the RDL 252 comprises Al, Cu, or another electrically conductive material, and is formed by PVD. A resulting structure 600B is obtained as shown in FIG. 6B.

As shown in FIG. 6B, the RDL 652 is covered by an additional photoresist layer 678. The photoresist layer 676 over the bottom 624 of the trench 620 and the facets 632 is removed to expose the underlying reflective material 675. The exposed reflective material 675 is removed, e.g., by an etching process, to expose the underlying dielectric layer 625. A remaining portion of the reflective material 675 under the photoresist layer 678 defines the reflective layer 626 over the inclined sidewall 622 of the trench 620. A resulting structure 600C is obtained as shown in FIG. 6C.

At operation 535, a waveguide is formed in the trench. For example, as shown in FIG. 6D, a waveguide 640 is formed in the trench 620. Specifically, the photoresist layer 678 is removed from the structure 600C of FIG. 6C. The RDL 652 is exposed after the removal of the photoresist layer 678. In some embodiments, another portion of the reflective material 675 is also covered by a photoresist layer and remains over the facets 632 to define a reflective layer 637 after the etching process described with respect to FIG. 6C. The reflective layer 637 and the facets 632 define the grating structure 630. In some embodiments, the reflective layer 637 is formed by a separate process from the reflective layer 626. In some embodiments, the reflective layer 637 is omitted, and the grating structure 630 includes the facets 632. A core layer 641 is deposited in the trench 620, over the bottom 624 and at least a portion of the reflective layer 626. A cladding layer 642 is deposited over the core layer 641 to obtain the waveguide 640. The core layer 641 and/or cladding layer 642 is/are formed in at least one embodiment from dielectric or polymer by chemical vapor deposition (CVD). A resulting structure 600D is obtained as shown in FIG. 6D.

At operation 545, an optical component is mounted over the substrate. For example, as show in FIG. 6E, a photoresist layer 679 is formed over the structure 600D. The photoresist layer 679 is developed and patterned to form at least one opening therein, and at least one solder bump 654 is formed in the at least one opening of the photoresist layer 679. Example process for forming the solder bump 654 include, but are not limited to, evaporation, electroplating, printing, jetting, stud bumping, and direct placement. A resulting structure 600E is obtained as shown in FIG. 6E.

Figure 6F:
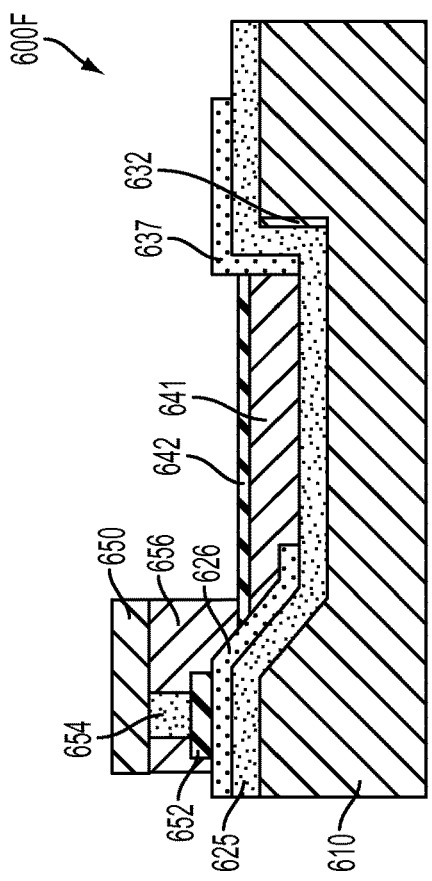
Figure 6E:
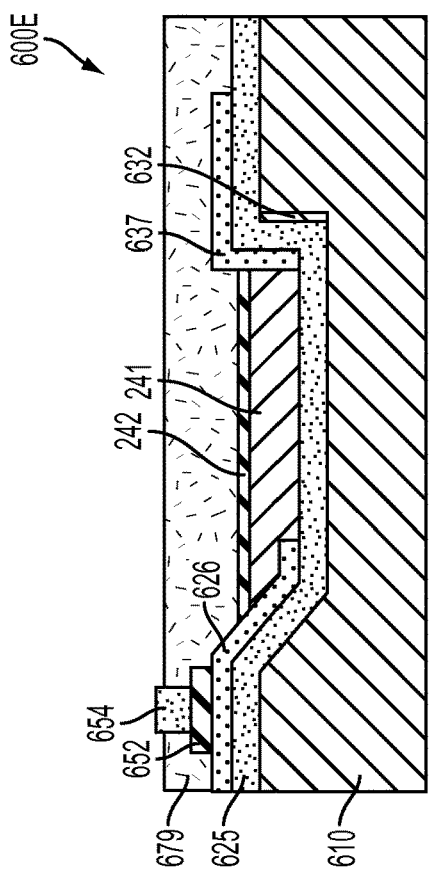

As shown in FIG. 6F, the photoresist layer 679 is removed from the structure 600E to expose the RDL 652 and solder bump 654. In some embodiments, an optical component 650 is flip-chip bonded to the solder bump 654 to be in an optical path with the reflective layer 626, the waveguide 640 and the grating structure 630. An underfill material 656 is filled in the space between the optical chip 650 and the reflective layer 626. Example materials of the underfill material 656 include, but are not limited to, polymers and other suitable non-conductive materials. A resulting structure 600F is obtained as shown in FIG. 6F. In some embodiments, the structure 600F corresponds to the semiconductor device 200 described with respect to FIG. 2.

In one of more embodiments described herein, the grating structure is formed by etching the substrate, e.g., the Si substrate. Other configurations of and/or methods for forming grating structures are within the scope of various embodiments. For example, in at least one embodiment described herein, a grating structure is formed by etching a block of dielectric material formed over the substrate.

FIGS. 7A-7D are schematic cross-sectional views of a substrate 710 at various stages during an etching operation for forming a grating structure in accordance with some embodiments. Elements in FIGS. 7A-7D having corresponding elements in FIGS. 3A-3D are designated by the reference numerals of FIGS. 3A-3D increased by four hundreds.

Figure 7A:
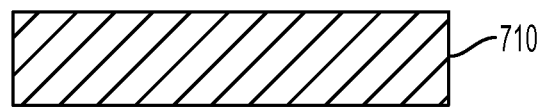
FIGS. 7A-7D are schematic cross-sectional views of a substrate at various stages during an etching operation for forming a grating structure in accordance with some embodiments.

As shown in FIG. 7A, the process starts at a substrate 710. In at least one embodiment, the substrate 710 includes an Si substrate.

Figure 7B:
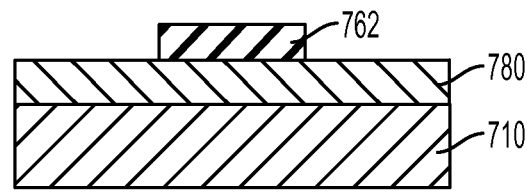

As shown in FIG. 7B, a dielectric material 780 is deposited over the substrate 710 and, then, a photoresist layer 762 is deposited over the dielectric material 780. In at least one embodiment, the photoresist layer 762 has a shape of the grating structure 130 of the semiconductor device 100 as seen in plan view. In some embodiments, the dielectric material 780 includes at least one of spin-on-glass (SOG) or $SiO_2$. The dielectric material 780 is formed to have a thickness corresponding to a thickness (or height) of the grating structure to be formed. In at least one embodiment, the dielectric material 780 is formed to have a thickness of at least 30 μm.

Figure 7C:
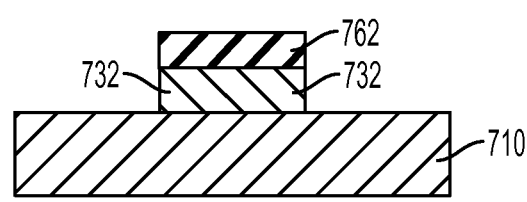

As shown in FIG. 7C, the photoresist layer 762 is used as an etching mask to etch away portions of the dielectric material 780 not covered by the 762. The remaining portion of the dielectric material 780 under the photoresist layer 762 has facets 732 corresponding to the shape of the photoresist layer 762. In at least one embodiment, the etching process is a dry etch. For example, the etching process is a plasma etch. The facets 732 formed by the etching process are generally vertical, i.e., oriented generally in the normal direction Z of the substrate 710. In at least one embodiment, the facets 732 are etched until the substrate 710 is exposed.

Figure 7D:
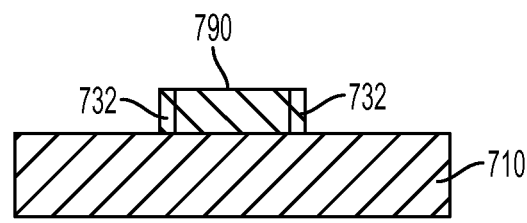

As shown in FIG. 7D, the photoresist layer 762 is removed, leaving a dielectric material block 790 having the facets 732 on the substrate 710. The facets 732 are formed in a sidewall of the dielectric material block 790.

Figure 8:
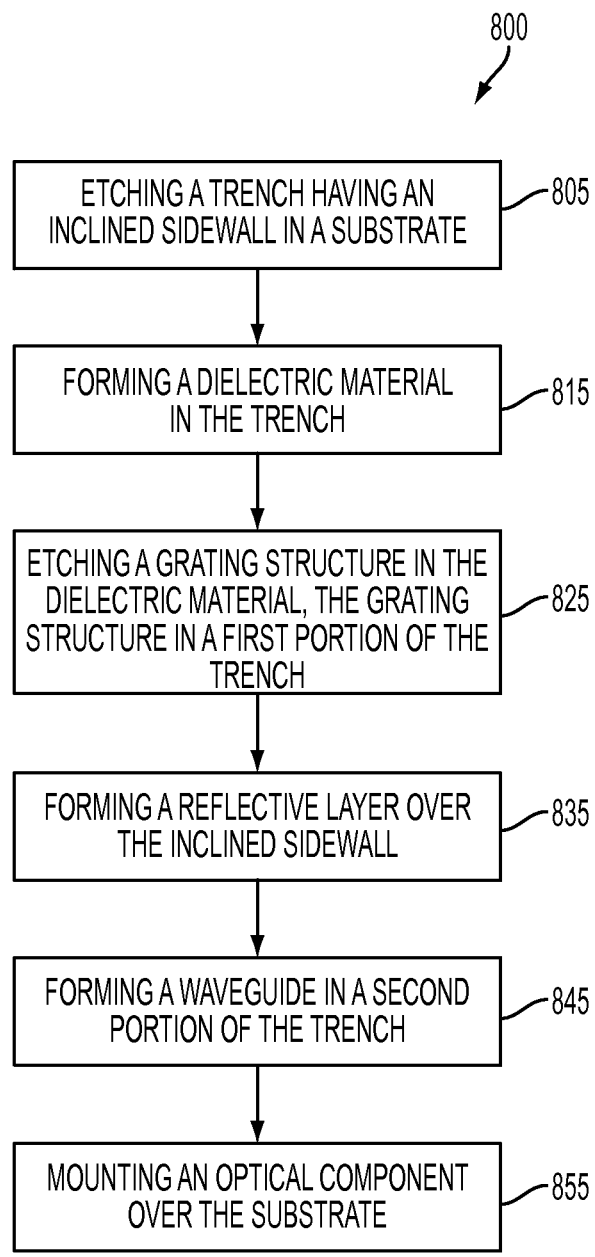
FIG. 8 is a flow chart of a method of manufacturing a semiconductor device in accordance with some embodiments.

FIG. 8 is a flow chart of a method 800 of manufacturing a semiconductor device in accordance with some embodiments, and FIGS. 9A-9D are schematic cross-sectional views of the semiconductor device at various stages during manufacture in accordance with some embodiments. Elements in FIGS. 9A-9D having corresponding elements in FIGS. 6A-6F are designated by the reference numerals of FIGS. 6A-6F increased by three hundreds. Elements in FIGS. 9A-9D having corresponding elements in FIGS. 7A-7D are designated by the reference numerals of FIGS. 7A-7D increased by two hundreds.

Figure 9A:
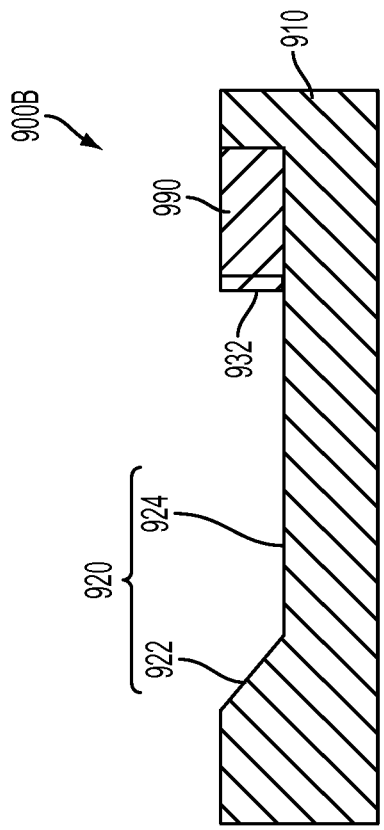
FIGS. 9A-9D are schematic cross-sectional views of a semiconductor device at various stages during manufacture in accordance with some embodiments.

At operation 805, a trench having an inclined sidewall is etched in a substrate. For example, as shown in FIG. 9A, a trench 920 having an inclined sidewall 922 is etched in a substrate 910, in the manner described with respect to FIGS. 4A-4D.

At operation 815, a dielectric material is formed in the trench. For example, as shown in FIG. 9A, a dielectric material 980 is filled in the trench 920, a photoresist layer 962 is formed over the dielectric material 980. In at least one embodiment, the dielectric material 980 and the photoresist layer 962 correspond to the dielectric material 780 and photoresist layer 762 described with respect to FIG. 7B. A resulting structure 900A is obtained as shown in FIG. 9A.

Figure 9B:
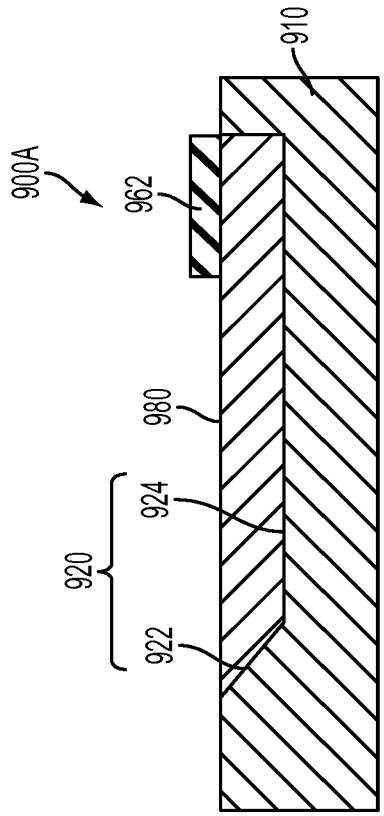

At operation 825, a grating structure is etched in the dielectric material. For example, as shown in FIG. 9B, the dielectric material 980 is etched with the photoresist layer 962 acting as the etching mask, in the manner described with respect to FIG. 7C. As a result, a dielectric material block 990 is formed in a first portion of the trench 920. The dielectric material block 990 includes facets 932 formed in a sidewall thereof, as described with respect to FIG. 7D. A resulting structure 900B is obtained as shown in FIG. 9B.

Figure 9C:
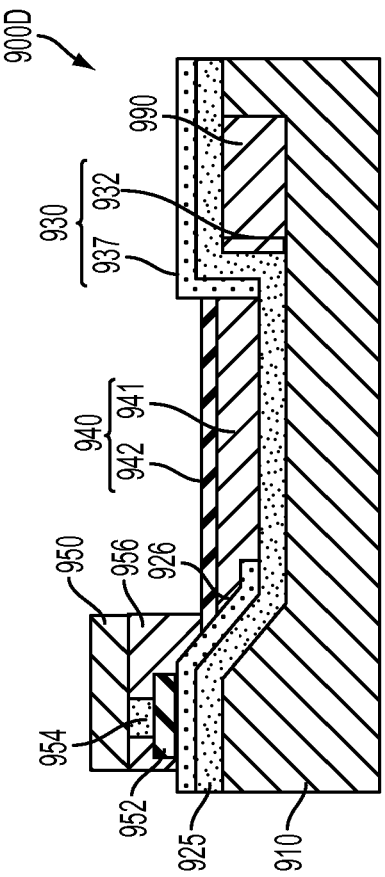

At operation 835, a reflective layer is formed over the inclined sidewall of the trench. For example, as shown in FIG. 9C and described with respect to FIG. 6A, a dielectric layer 925 is formed to extend continuously over the inclined sidewall 922 and the bottom 924 of the trench 920, and over the dielectric material block 990 with the facets 932. A reflective material 975 is formed over the dielectric layer 925 to continuously extending over the inclined sidewall 922, the bottom 924 of the trench 920, and the facets 932. A resulting structure 900C is obtained as shown in FIG. 9C.

As described with respect to FIGS. 6B-6C, a photoresist layer 976 is formed over the reflective material 975 of the structure 900C, an RDL 952 is formed in at least one opening of the photoresist layer 976, and the reflective material 975 over the bottom 924 of the trench 920 is removed. A remaining portion of the reflective material 975 defines a reflective layer 926 over the inclined sidewall 922 of the trench 920, and another remaining portion of the reflective material 975 over the facets 932 defines a reflective layer 937 of the grating structure 930.

Figure 9D:
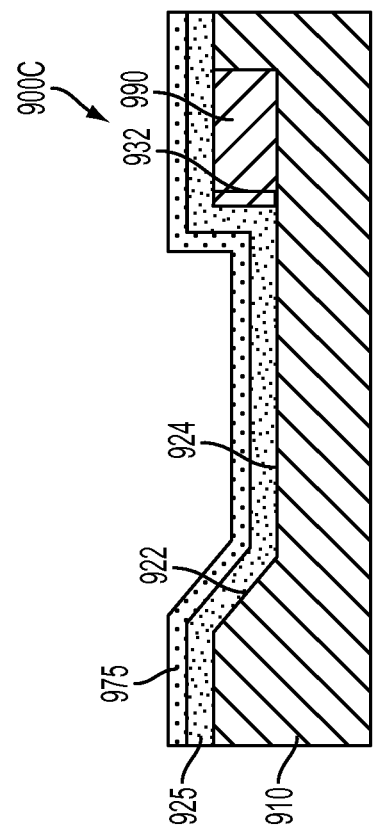

At operation 845, a waveguide is formed in a second portion of the trench. For example, as shown in FIG. 9D and described with respect to FIG. 6D, a waveguide 940 including a core layer 941 and a cladding layer 942 is formed in a second portion of the trench 920.

At operation 855, an optical component is mounted over the substrate. For example, as shown in FIG. 9D and described with respect to FIGS. 6E-6F, at least one solder bump 954 is formed over the RDL 952, an optical component 950 is flip-chip bonded to the solder bump 954 to be in an optical path with the reflective layer 926, the waveguide 940 and the grating structure 930. An underfill material 956 is filled in the space between the optical chip 950 and the reflective layer 926. A semiconductor device 900D is obtained as shown in FIG. 9D. One or more effects described with respect to the semiconductor device 100 are applicable to the semiconductor device 900D.

The above methods include example operations, but they are not necessarily required to be performed in the order shown. In some embodiments, operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a semiconductor device comprises a substrate, a trench in the substrate, the trench having an inclined sidewall, a reflective layer over the inclined sidewall, a grating structure over the substrate, and a waveguide in the trench. The waveguide is configured to guide optical signals between the grating structure and the reflective layer.

In a method of manufacturing a semiconductor device in accordance with some embodiments, a trench is etched in a substrate, the trench having an inclined sidewall. A grating structure is etched in the substrate. The grating structure is at least partially co-elevational with the inclined sidewall. The grating structure includes facets oriented in a direction closer to the normal direction of the substrate than the inclined sidewall. A reflective layer is formed over the inclined sidewall. A waveguide is formed in the trench. An optical component is mounted over the substrate. The grating structure, the waveguide, the reflective layer and the optical component are arranged along an optical path.

In a method of manufacturing a semiconductor device in accordance with some embodiments, a trench is etched in a substrate, the trench having an inclined sidewall. A dielectric material is formed in the trench. A grating structure is etched in the dielectric material, the grating structure located in a first portion of the trench. The grating structure is at least partially co-elevational with the inclined sidewall. The grating structure includes facets oriented in a direction closer to the normal direction of the substrate than the inclined sidewall. A reflective layer is formed over the inclined sidewall. A waveguide is formed in a second portion of the trench. An optical component is mounted over the substrate. The grating structure, the waveguide, the reflective layer and the optical component are arranged along an optical path.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A semiconductor device comprising:
a trench extending from a top surface of a substrate into the substrate, the trench having an inclined sidewall, an angle between the inclined sidewall and a plane of the substrate being between 40 degrees to 50 degrees;
a grating structure located within the substrate, at least a portion of the grating structure being level with the inclined sidewall, the grating structure including facets oriented in a direction closer to a normal direction of the top surface of the substrate than the inclined sidewall;
a reflective layer located over the inclined sidewall, the reflective layer having at least 90% reflectivity and wherein the reflective layer comprises:
a dielectric layer over the substrate, the dielectric layer continuously extending over the inclined sidewall, a bottom of the trench, and the facets of the grating structure;
a reflective material over the inclined sidewall;
a waveguide in the trench, the waveguide comprising a core layer and a cladding layer, a refractive index difference between the core layer and the cladding layer being in a range from 0.05 to 1; and
an optical component over the substrate 110, the optical component being a light emitting device or a light detecting device, wherein the grating structure, the waveguide, the reflective layer and the optical component are arranged along an optical path.
2. The semiconductor device of claim 1, wherein the reflective material comprises copper.

3. The semiconductor device of claim 1, wherein the reflective material comprises gold.

4. The semiconductor device of claim 1, wherein the reflective material comprises silver.

5. The semiconductor device of claim 1, wherein the reflective material comprises aluminum.

6. The semiconductor device of claim 1, wherein the reflective material comprises titanium.

7. The semiconductor device of claim 1, wherein the core layer and the cladding layer include at least one selected from the group consisting of polymer, spin-on-dielectric, high-k material, $SiO_2$, $SiN_x$, and low-k material.

8. A semiconductor device comprising:
a substrate;
a trench in the substrate, the trench having an inclined sidewall, an angle between the inclined sidewall and a plane of the substrate being between 40 degrees to 50 degrees, the inclined sidewall extending from a top surface of the substrate into the substrate;
a dielectric material in the trench;
a grating structure in the dielectric material, the grating structure being located in a first portion of the trench, the grating structure being level with the inclined sidewall, the grating structure including facets oriented in a direction closer to a normal direction of the top surface of the substrate than the inclined sidewall;
a reflective layer over the inclined sidewall, the reflective layer having at least 90% reflectivity; and
a waveguide in a second portion of the trench, the waveguide comprising a core layer and a cladding layer, a refractive index difference between the core layer and the cladding layer being in a range from 0.05 to 1; and
an optical component over the substrate, the optical component being a light emitting device or a light detecting device, wherein the grating structure, the waveguide, the reflective layer and the optical component are arranged along an optical path.

9. The semiconductor device of claim 8, wherein the dielectric material comprises silicon dioxide.

10. The semiconductor device of claim 8, wherein the dielectric material comprises spin-on-glass.

11. The semiconductor device of claim 8, wherein the core layer and the cladding layer include at least one selected from the group consisting of polymer, spin-on dielectric, high-k material, $SiO_2$, $SiN_x$, and low-k material.

12. The semiconductor device of claim 8, wherein the reflective layer comprises at least one selected from the group consisting of Cu, Au, Ag, Al, Ti.

13. The semiconductor device of claim 12, wherein the reflective layer has a thickness of at least 50 nm.

14. The semiconductor device of claim 8, wherein the core layer has a thickness of at least 15 μm.

15. A semiconductor device comprising:
an opening in a semiconductor substrate, a sidewall of the opening having a top portion and a bottom portion, wherein an angle between the sidewall and the semiconductor substrate is between 40 degrees and 50 degrees, wherein the top portion is laterally offset from the bottom portion;
a reflector covering the top portion and the bottom portion, the reflector having at least 90% reflectivity;
a grating structure over the semiconductor substrate, the grating structure comprising a plurality of facets angled relative to each other to form a plurality of teeth;
a waveguide in the opening to guide optical signals between the grating structure and the reflector, the waveguide comprising a core layer and a cladding layer, a refractive index difference between the core layer and the cladding layer being in a range from 0.05 to 1; and
an optical component over the semiconductor substrate, the optical component being a light emitting device or a light detecting device.

16. The semiconductor device of claim 15, wherein the reflector comprises Cu, Au, Ag, Al or Ti.

17. The semiconductor device of claim 15, wherein the grating structure is concave.

18. The semiconductor device of claim 15, wherein the grating structure is configured to multiplex optical signals.

19. The semiconductor device of claim 15, wherein the reflector comprises a multi-layered structure of high and low refractive index alternately arranged dielectric materials.

20. The semiconductor device of claim 15, wherein the grating structure comprises facets oriented in a direction closer to a normal direction of the semiconductor substrate than the sidewall.

* * * * *